United States Patent
Shetty et al.

(10) Patent No.: US 9,575,132 B2
(45) Date of Patent: Feb. 21, 2017

(54) METHOD AND SYSTEM FOR CALCULATING ACCURATE BATTERY PERCENTAGE USAGE IN WIRELESS FIELD DEVICES

(71) Applicant: Honeywell International Inc., Morristown, NJ (US)

(72) Inventors: Udaya Shetty, Bangalore (IN); Prasad Samudrala, Bangalore (IN); Channabasavaraj Raravi, Bangalore (IN); Norman Swanson, Douglassville, PA (US)

(73) Assignee: Honeywell International Inc., Morris Plains, NJ (US)

( * ) Notice: Subject to any disclaimer, the term of this patent is extended or adjusted under 35 U.S.C. 154(b) by 232 days.

(21) Appl. No.: 14/333,610

(22) Filed: Jul. 17, 2014

(65) Prior Publication Data

US 2016/0018470 A1    Jan. 21, 2016

(51) Int. Cl.
*G01R 31/36*    (2006.01)
(52) U.S. Cl.
CPC ....... *G01R 31/3651* (2013.01); *G01R 31/3606* (2013.01)
(58) Field of Classification Search
CPC .................................................. G01R 31/3651
USPC ......................................................... 324/426
See application file for complete search history.

(56) References Cited

U.S. PATENT DOCUMENTS

| | | | |
|---|---|---|---|
| 6,002,673 A | 12/1999 | Kahn et al. | |
| 7,359,713 B1 | 4/2008 | Tiwari | |
| 7,986,657 B2 | 7/2011 | Dobrowski et al. | |
| 7,986,968 B2 | 7/2011 | Dobrowski et al. | |
| 8,005,020 B2 | 8/2011 | Karschnia | |
| 8,103,316 B2 | 1/2012 | Chakraborty et al. | |
| 8,160,618 B2 | 4/2012 | Harris | |
| 8,175,568 B2 | 5/2012 | Ponce | |
| 8,547,876 B1 | 10/2013 | Clement et al. | |
| 8,639,219 B2 * | 1/2014 | Little | G06F 21/31 320/106 |
| 8,676,219 B2 | 3/2014 | Pratt, Jr. et al. | |
| 2002/0065631 A1 * | 5/2002 | Loechner | G05B 19/4185 702/188 |

(Continued)

FOREIGN PATENT DOCUMENTS

WO    2010018116 A1    2/2010

OTHER PUBLICATIONS

PCT International Search Report for PCT/US2015/039495 dated Oct. 12, 2015.

*Primary Examiner* — Drew A Dunn
*Assistant Examiner* — Jerry D Robbins
(74) *Attorney, Agent, or Firm* — Kermit D. Lopez; Luis M. Ortiz; Ortiz & Lopez, PLLC

(57) ABSTRACT

Methods and systems are disclosed herein for accurately calculating battery consumption in a wireless field device. The total current consumed by a radio board associated with a wireless field device can be determined based on the sum of the current consumed as a result of particular events occurring at the radio board. The current consumed by a sensor board of the wireless field device can then be averated with respect to particular type of sensor. The current consumed by the radio board and the current consumed by the sensor board in the wireless field device can be combined to calculate a predictive value indicative of a remaining life of a battery associated with the wireless field device.

20 Claims, 7 Drawing Sheets

(56) References Cited

U.S. PATENT DOCUMENTS

| | | | |
|---|---|---|---|
| 2008/0125884 A1* | 5/2008 | Schumacher | G05B 19/4185 |
| | | | 700/79 |
| 2008/0174282 A1 | 7/2008 | Kano et al. | |
| 2010/0114510 A1* | 5/2010 | Vaingast | G01R 31/3648 |
| | | | 702/62 |
| 2010/0161081 A1* | 6/2010 | Seiler | G05B 19/0423 |
| | | | 700/12 |
| 2010/0261044 A1* | 10/2010 | Thoren | H02J 7/0004 |
| | | | 429/92 |
| 2012/0002605 A1* | 1/2012 | Yoshino | H04L 41/0833 |
| | | | 370/328 |
| 2012/0236769 A1* | 9/2012 | Powell | G05B 19/0426 |
| | | | 370/310 |
| 2012/0315959 A1 | 12/2012 | Book et al. | |
| 2013/0082667 A1* | 4/2013 | Sinreich | H02J 1/10 |
| | | | 323/234 |
| 2013/0278395 A1* | 10/2013 | Johnson | G05B 19/0423 |
| | | | 340/12.5 |
| 2013/0289908 A1* | 10/2013 | Nonoyama | G01R 31/362 |
| | | | 702/63 |
| 2014/0045481 A1 | 2/2014 | Fraley | |
| 2014/0068314 A1* | 3/2014 | Kim | G06F 1/3212 |
| | | | 713/340 |

* cited by examiner

60 ↘

| Total battery capacity | Present utilized Battery current | Previous utilized Battery current | Delta current (Calculated every 1 month once) | Battery current left= total - present utilized current | Battery forecast (in months)=(Battery current left * Delta Time)/delta utilized current |
|---|---|---|---|---|---|
| 50760000 | 2500000 | 0 | 2500000 | 48260000 | 19.3 |
| 50760000 | 5000000 | 2500000 | 2500000 | 45760000 | 18.3 |
| 50760000 | 7500000 | 5000000 | 2500000 | 43260000 | 17.3 |
| 50760000 | 10000000 | 7500000 | 2500000 | 40760000 | 16.3 |
| 50760000 | 12500000 | 10000000 | 2500000 | 38260000 | 15.3 |
| 50760000 | 15000000 | 12500000 | 2500000 | 35760000 | 14.3 |
| 50760000 | 17500000 | 15000000 | 2500000 | 33260000 | 13.3 |
| 50760000 | 20000000 | 17500000 | 2500000 | 30760000 | 12.3 |
| 50760000 | 22500000 | 20000000 | 2500000 | 28260000 | 11.3 |
| 50760000 | 25000000 | 22500000 | 2500000 | 25760000 | 10.3 |
| 50760000 | 27500000 | 25000000 | 2500000 | 23260000 | 9.3 |
| 50760000 | 30000000 | 27500000 | 2500000 | 20760000 | 8.3 |
| 50760000 | 32500000 | 30000000 | 2500000 | 18260000 | 7.3 |
| 50760000 | 35000000 | 32500000 | 2500000 | 15760000 | 6.3 |
| 50760000 | 37500000 | 35000000 | 2500000 | 13260000 | 5.3 |
| 50760000 | 40000000 | 37500000 | 2500000 | 10760000 | 4.3 |
| 50760000 | 42500000 | 40000000 | 2500000 | 8260000 | 3.3 |
| 50760000 | 45000000 | 42500000 | 2500000 | 5760000 | 2.3 |
| 50760000 | 47500000 | 45000000 | 2500000 | 3260000 | 1.3 |
| 50760000 | 50000000 | 47500000 | 2500000 | 760000 | 0.3 |

FIG. 5

METHOD AND SYSTEM FOR CALCULATING ACCURATE BATTERY PERCENTAGE USAGE IN WIRELESS FIELD DEVICES

FIELD OF THE INVENTION

Embodiments are generally related to wireless field devices including battery powered wireless communication devices and wireless field routers employed in wireless industrial applications and processes. Embodiments are also related to field devices for use in monitoring or controlling industrial processes and systems. Embodiments are additionally related to techniques and devices for conserving battery power in such field devices and routers.

BACKGROUND

Wireless-based battery powered field routers and field devices are utilized in a variety of wireless industrial applications such as critical remote monitoring required industrial plants and facilities. Such wireless devices may employ communications protocols and networks such as, for example, TDMA, COMA, GSM, WiFi, etc.

Field devices are used in industrial processes to control or monitor operation of the process. Wireless field devices can measure any of a number of process characteristics such as, for example, pressure, level, flow velocity, mass flow, pH, temperature, density, and conductivity or can monitor process equipment for such things as vibration, strain or corrosion or can monitor the general plant environment for such things as fire and gas detection or can be used for locating the present position of workers and equipment. For example, a process variable transmitter is a type of field device which can be used to monitor a process variable of a process fluid. Examples process variables include temperature, pressure, level, flow rate, etc. A controller is a type of field device which is used to control operation of the process. For example, the controller can control a flow rate of a process fluid by adjusting a position of a valve in a pipe carrying the fluid.

The ability to resolve problems observed in estimating battery capacity and battery capacity remaining are critical in, for example, TDMA based battery powered field routers/field devices for wireless industrial applications. Battery draining in field devices does not follow a linear curve when plotted, for example, with respect to battery voltage versus time scale. Rather, such data indicates a very negligible drop in the beginning when the battery voltage is high and drops drastically close to the end of the battery life. Using traditional method to detect the battery voltage level using, for example, a DAC (Digital-to-Analog Converter) circuit in the microcontroller does not help the end user as the remaining battery voltage drops down to very low with a short span of time and the user or customer will not have enough time to replace the batteries once an alarm is generated by the system due to the nature of the battery voltage reduction.

Conventional DAC based battery measurement techniques read the battery voltage and report the battery voltage. Potential problems with DAC based voltage measurement techniques include, for example, issues related to the fact that a typical field device may indicate a lower battery for only a short duration before draining completely, which unfortunately impacts the drop-offs associated with the wireless field device(s), which may be monitoring, for example, critical industrial plant parameters. Additionally, field devices are used to monitor plant critical parameters. Thus, the end user must be very vigilant for low battery alarms, which eventually may result in wireless field devices drop-offs in industrial applications if neglected. Plant operations can therefore be negatively impacted simply due to a failure to monitor lower battery alarms. Additionally, the DAC based technique of battery measurement will not be able to show the battery remaining in terms of percentage or days left due to the sudden fall of battery characteristics. Solutions are therefore presented herein to these and other problems inherent with present battery monitoring and measurement techniques.

SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide methods and systems for resolving problems associated with estimating the battery capacity used/remaining battery capacity in wireless based battery powered field routers and devices for wireless industrial applications.

It is another aspect of the disclosed embodiments to provide methods and systems for estimating battery life remaining forecasts in any wireless-based networks (e.g., TDMA, COMA, GSM, WiFi, etc.).

A field device may contain two elements. One element may be a sensing element and the other element may be an RF communication element referred to herein as a "radio". For the sake of the discussion herein, the sensing element is referred to as a sensor board and RF communication element is referred to as a radio board. The aforementioned aspects and other objectives and advantages can now be achieved as described herein. Methods and systems are disclosed herein for accurately calculating battery consumption in a wireless field device. Such a wireless field device can contain two elements—a sensing element and an RF communications element (e.g., "radio"). For the sake of the discussion herein, the sensing element can be referred to as a "sensor board," and the RF communications element can be referred to as a "radio board."

The total current consumed by the radio board associated with a wireless field device can be determined based on the sum of the current consumed as a result of particular events occurring at the radio board. The current consumed by the sensor board of the wireless field device can then be average with respect to particular type of sensor. The current consumed by the radio board and the current consumed by the sensor board in the wireless field device can be combined to calculate a predictive value indicative of a remaining life of a battery associated with the wireless field device. Data derived from the radio board can be analyzed to determine the total current consumed by the radio board. Additionally, data derived from the sensor board can be analyzed to determine the current consumed by the sensor board. The particular events can be, for example, a transmission mode, a reception mode, and/or a sleep mode associated with the radio board. Such events are also associated with events respect to a wireless field router. The sensor board can be associated sensors such as, for example, a temperature sensor, a pressure sensor, a humidity sensor, etc.

Embodiments thus provide solutions that use the events occurring in a wireless based field router or other wireless field device. A wireless based field device radio board can enter, for example, three different modes: transmission, reception, and sleep. These are thus events that can occur at a radio board. The total current consumed by the radio board is the sum of current consumed by, for example, the above three events. The current consumed by the sensor board can be averaged for a given type of sensor (e.g., temperature, pressure, humidity, etc.). Wireless field devices measure and report the sensor value based on the configured published interval. Thus, the sensor average current consumption is calculated based on the configured published interval. When the current consumed by the radio board and the current consumed by the sensor board in a field device are calculated and combined, an accurate prediction of the battery life remaining can be obtained.

BRIEF DESCRIPTION OF THE FIGURES

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIGS. 5, 6, and 7 respectively illustrate an example table and graphs indicating that the fall in battery life remaining is gradual rather than a sharp fall;

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

Figure 1:
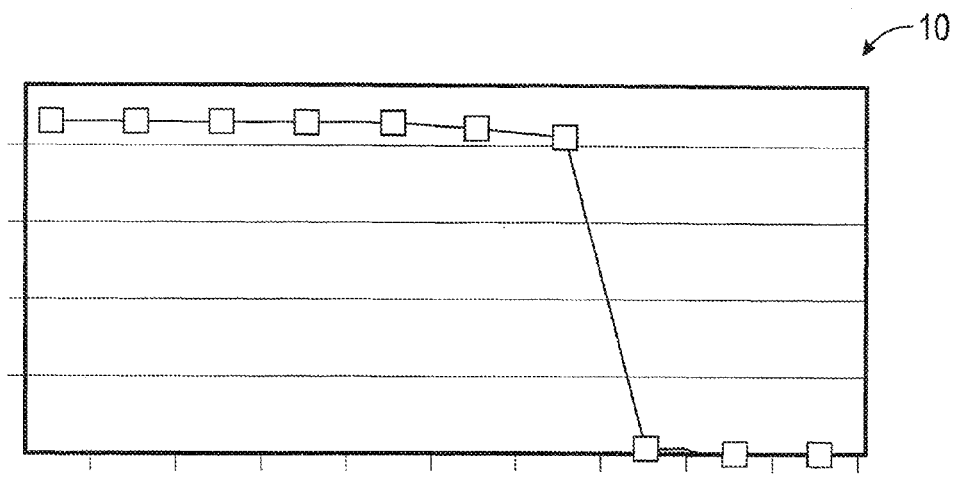
FIG. 1 illustrates an example graph depicting a linear curve plotted with respect to battery voltage versus time scale.

FIG. 1 illustrates an example graph 10 depicting a linear curve plotted with respect to battery voltage versus time scale. The disclosed embodiments address the problem observed in estimating the battery capacity used and battery capacity remaining in wireless based battery powered field routers/field devices for wireless industrial applications, as discussed earlier. As shown in graph 10, the battery draining in field devices will not follow a linear curve when plotted with respect to the battery voltage vs. time scale; rather, graph 10 illustrates a very negligible drop in the beginning when the battery voltage is high and drops drastically close to the end of the battery life. Using traditional methods to detect the battery voltage level using a DAC circuit in the microcontroller does not help the end user as the remaining battery voltage drops down to very low within a short span of time and customer will not have enough time to replace the batteries once an alarm is generated by the system due to the nature of the battery voltage reduction as shown below. The conventional DAC based battery measurement techniques will read the battery voltage and report the battery voltage.

Figure 2:
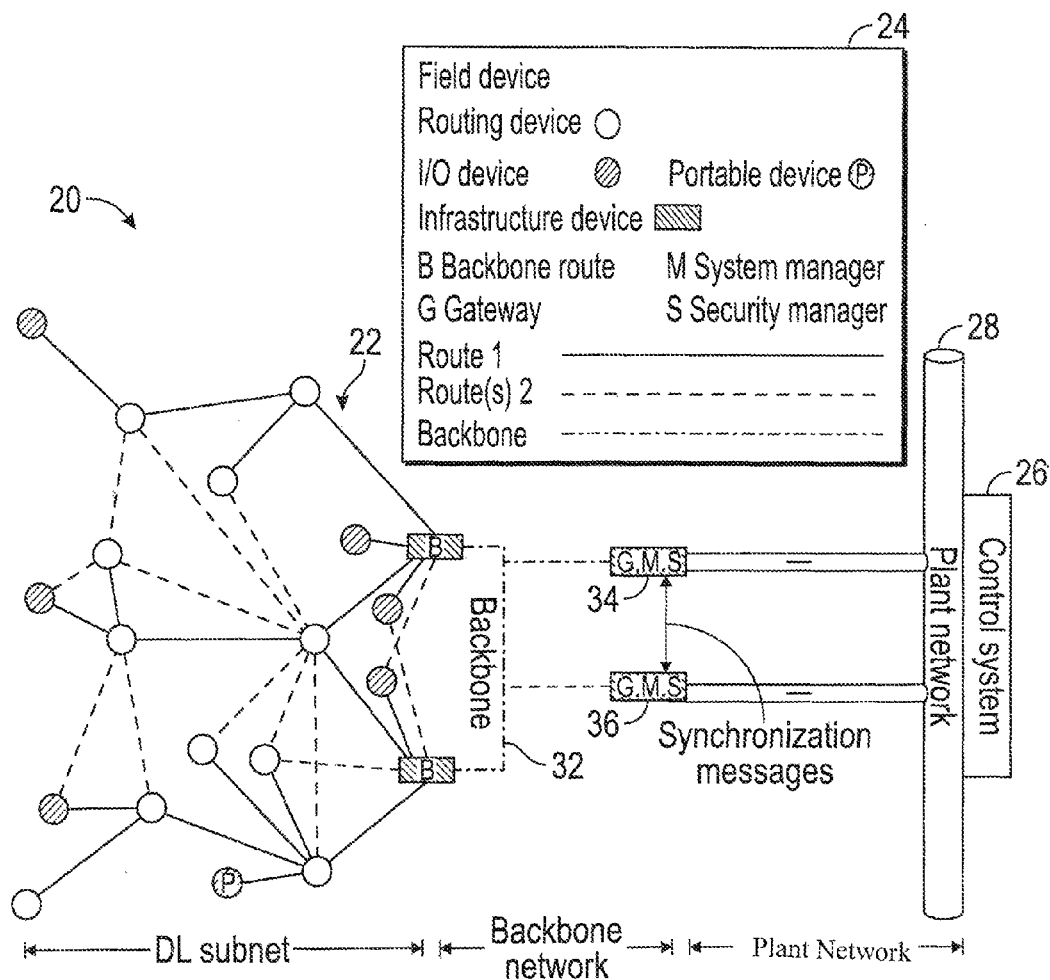
FIG. 2 illustrates a schematic diagram of an example ISA100 wireless plant network based on TDMA, in accordance with an example embodiment.

FIG. 2 illustrates a schematic diagram of an example ISA100 wireless plant system 20 based on TDMA, in accordance with an example embodiment. System 20 generally includes a subnet 22 (sub-network) which communicates with a backbone network 32, which in turn communicates with messaging components 34, 36 that are capable of message synchronization and which in turn communicate with plant network 28 that communicates with control system 26. The subnet, backbone network and plant network portions are also shown by arrows in FIG. 2. Field device features are shown in legend 24 and indicates a variety of features associated with field devices with respect to the network configuration 20.

Figure 3:
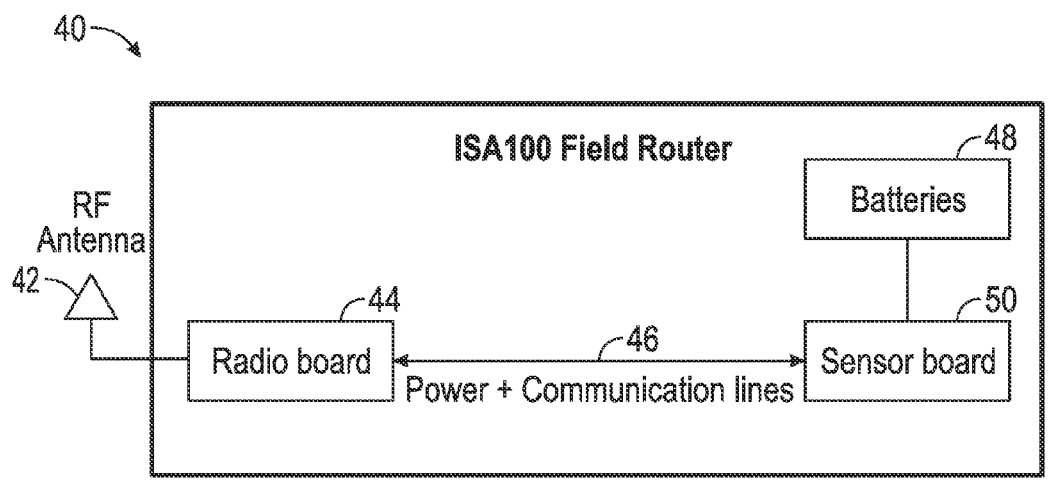
FIG. 3 illustrates a block diagram of an example battery powered field router/field device utilized in an industrial application and in which a preferred embodiment can be implemented.

FIG. 3 illustrates a block diagram of an example battery powered field router/field device 40, which can be implemented in an industrial environment such as the wireless plant network configuration 20 shown in FIG. 2 and in which a preferred embodiment can be implemented. In the example shown in FIG. 3, the field device 40 can be implemented as an ISA100 field router. It can be appreciated, however, that the disclosed embodiments are not limited to ISA100 devices and components, but can be implemented as other types of routers/devices. Reference is made to ISA100 for exemplary purposes only and is not to be considered a limiting feature of the disclosed embodiments. The wireless field device 40 can include, for example, a radio board 44 along with power and communication lines 46 for communication with a sensor board 50 and an RF antenna 42. The sensor board 50 can be powered by batteries (power supply) 48.

In a TDMA scenario, for example, the radio board 44 may enter three different modes, namely transmission, reception, and sleep. These can be considered "events" that occur at the radio board 44. The total current consumed by the radio board 44 is the sum of the current consumed by the aforementioned events. The current consumed by sensor board 50 can be averaged for a given type of sensor (e.g., temperature, pressure, humidity etc.).

Figure 4:
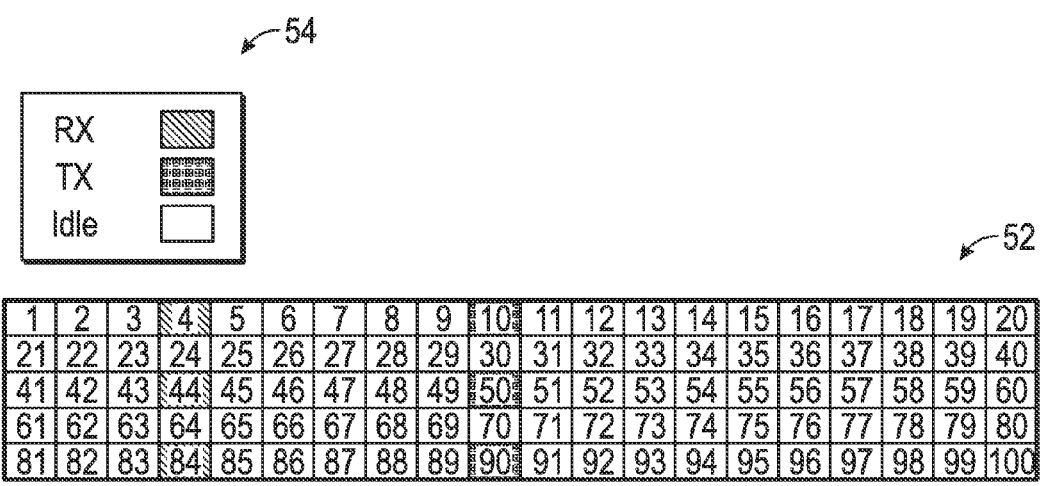
FIG. 4 illustrates an example table indicating a one-second representation of TDMA based slot structuring with respect to an example embodiment.

FIG. 4 illustrates an example table 52 indicating a one-second representation of TDMA based slot structuring in accordance with an example embodiment. A legend 54 is indicated with respect to table 52 per Rx, Tx, and idle parameters. The example table 54 indicates a one-second representation of TDMA based slot structuring. In this example, every slot is of 10 milliseconds duration, and there are 3 transmit slots and 3 receive slots within a second. The following formulation applies: the total number of sleep slots=total number of slots–total transmit slots –total receive slots. Table 1 below indicates possible parameters that can be employed for battery consumption calculation according to the disclosed embodiments:

TABLE 1

| | |
|---|---|
| Cumulative_Uptime | total uptime from the time fresh batteries are placed (Units in seconds) |
| Cumulative_Tx_Slot_Count | total transmit slots count from the time fresh batteries are placed |
| Cumulative_Rx_Slot_Count | total receive slot count from the time fresh batteries are placed |
| TX_SLOT_CURRENT | Average transmit slot current (Calculated based on the transmit power level set) (Unit is milliAmperemilliSeconds) |
| RX_SLOT_CURRENT | Average receive slot current (Unit is milliAmperemilliSeconds) |
| SLEEP_SLOT_CURRENT | Average sleep slot current (Unit is milliAmperemilliSeconds) |

Following table mentions some of the parameters used for battery consumption calculation.

| | |
|---|---|
| Cumulative_Uptime | total uptime from the time fresh batteries are placed (Units in seconds) |
| Cumulative_Tx_Slot_Count | total transmit slots count from the time fresh batteries are placed |
| Cumulative_Rx_Slot_Count | total receive slot count from the time fresh batteries are placed |
| TX_SLOT_CURRENT | Average transmit slot current (Calculated based on the transmit power level set) (Unit is milliAmperemilliSeconds) |
| RX_SLOT_CURRENT | Average receive slot current (Unit is milliAmperemilliSeconds) |
| SLEEP_SLOT_CURRENT | Average sleep slot current (Unit is milliAmperemilliSeconds) |

A methodology for calculating accurate battery percentage usage in wireless field devices can be implemented as follows:

1) Derive total number of slots processed by device from uptime (after replacing fresh batteries)

TotalNumberOfSlots=Cumulative_Uptime*NUMBER_SLOTS_PER_SECOND (In the above mentioned TDMA case, NUMBER_SLOTS_PER_SECOND=100)

2) Calculate total number of sleep slot

TotalNumberOfSleepSlots=TotalNumberOfSlots–Cumulative_$Tx$_Slot_Count–Cumulative_$Rx$_Slot_Count     a.

3) Calculate total power consumed (Ams)

Battery_Utilise_Radio_Alone=
   (Cumulative_$Tx$_Slot_Count*$TX$_SLOT_CURRENT)+
   (Cumulative_$Rx$_Slot_Count*$RX$_SLOT_CURRENT)+
   (TotalNumberOfSleepSlots*SLEEP_SLOT_CURRENT)/1000     a.

Battery_Utilised_FieldRouter=Battery_Utilise_Radio_Alone+ Battery_Utilised_Sensor_Alone     b.

4) Based on set transmit power level of the Field Router the TX_SLOT_CURRENT can be calculated.

5) Total battery capacity: This is derived from datasheet of the Batteries used. If Battery capacity is given in terms of AHr, we can convert it into Amsec using the following formula (Considering battery capacity is 14.1 AHr):

BATTERY_CAPACITY=(14.1 AHr*1000*60*60) Ams=50760000Ams     a.

6) Battery capacity remaining % calculation:

Battery_Remaining=(BATTERY_CAPACITY–Battery_Utilised_FieldRouter)*100/BATTERY_CAPACITY 7) Battery_Life_remaining (in seconds or in days) calculation.

A moving window can be considered, which is used to calculate the battery life remaining in seconds. The time period of this moving window can be fixed, for example, every 4 hours. Based on how much power is consumed in this 4 hour interval, the estimation of battery life remaining in seconds can be accomplished because the remaining battery life (in Amsec) is known. The equations used for calculation are as follows:

Battery_life_remaining (in seconds)=(BATTERY_CAPACITY–Battery_Utilised)*Delta_Uptime/Delta_Battery_Utilised.

Battery_life_remaining (in days)=Battery_life_remaining (in seconds)/(24*60*60)

After calculating delta save, the Battery_Utilised_FieldRouter parameter in non-volatile memory is Prev_Battery_Utilised_FieldRouter. This is required to calculate the delta. The formulation can be as follows:

Delta_Battery_Utilised=Battery_Utilised_FieldRouter–Prev_Battery_Utilised_FieldRouter.

Figure 6:
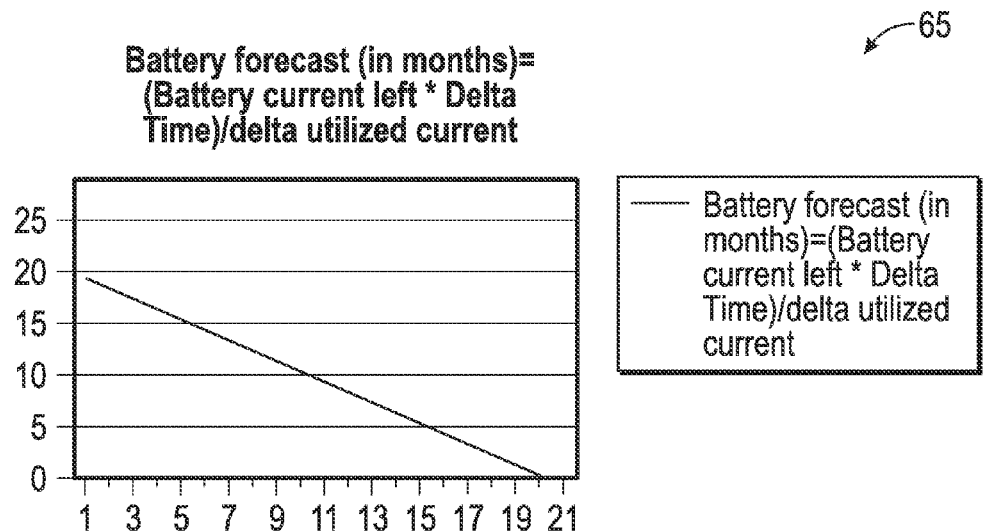
Figure 7:
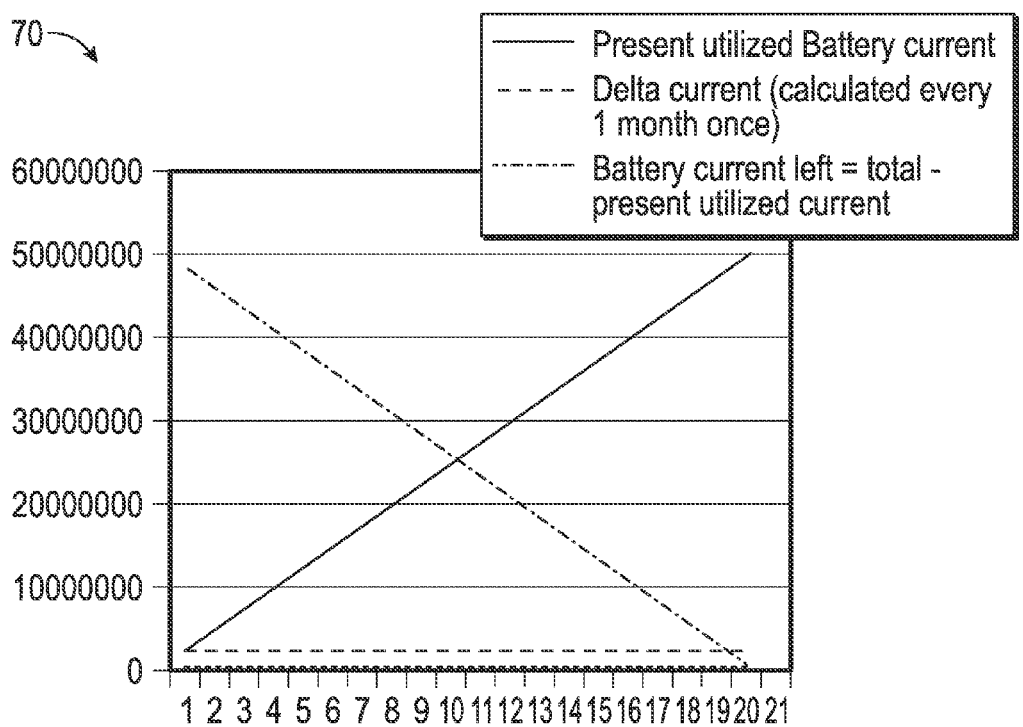

FIGS. 5, 6 and 7 respectively illustrate an example table 60 and graphs 65, 70 indicating that the fall in battery life remaining is gradual rather than a sharp fall. In the example graphs, the delta value can be taken as 2500000 Amsec corresponding to 1 month duration of delta time. The graphs 65, 70 demonstrate that the fall in battery life remaining is gradual and not a sharp fall. The battery capacity of 14.1 AHr (or 50760000 Amsec) is considered in table 60 for battery life remaining forecast.

Cumulative counters indicate in the Table 2 below should be saved in non-volatile memory for calculation of battery statistics. When fresh batteries are inserted to the field router, these counters should be reset to zero. This will ensure that the battery utilized becomes zero meaning that the batteries are treated as new by the battery prediction logic.

TABLE 2

| |
|---|
| Cumulative_Uptime |
| Cumulative_Tx_Slot_Count |
| Cumulative_Rx_Slot_Count |
| Delta_Battery_Utilised |
| Prev_Battery_Utilised_FieldRouter |

Figure 8:
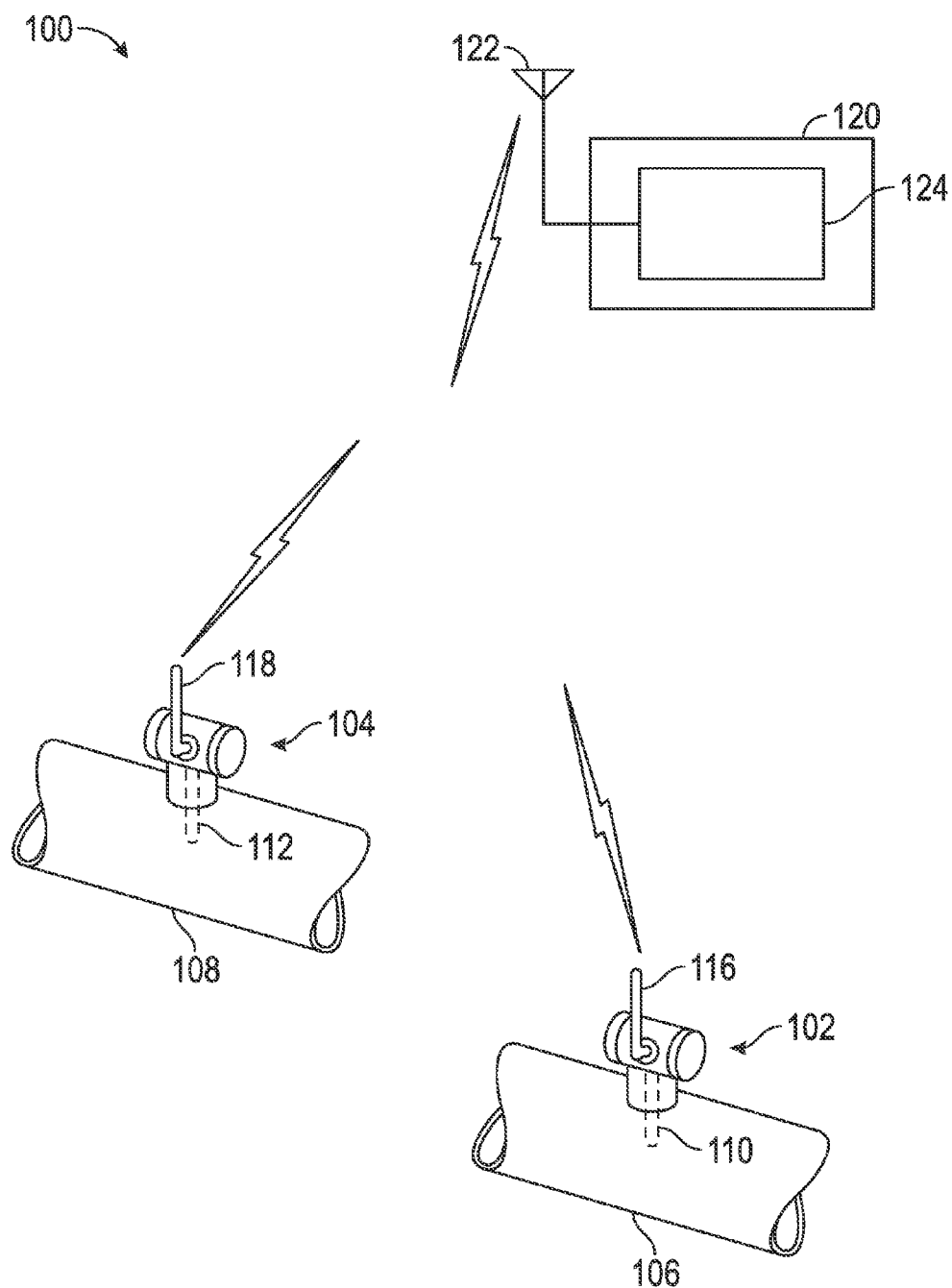
FIG. 8 illustrates a schematic diagram of an industrial process control system include example wireless field devices, in which an alternative embodiment may be implemented.

FIG. 8 illustrates a simplified diagram depicting an industrial system 100 including field devices 102 and 104, which may be implemented in accordance with an alternative embodiment. Field devices 102 and 104 are analogous to the field device 40 shown in FIG. 3, but with variations in usage. Field devices 102 and 104 are illustrated as being coupled to process piping 106 and 108, respectively. Field devices 102 and 104 can include processing interface elements 110 and 112, respectively. These process interface elements can include a sensor that is used to sense a process variable of, for example, a process fluid. Example process variables include temperature, pressure, flow, pH, etc. Similarly, the process interface elements 110, 112 can comprise control elements which are used to control a process variable.

Example control elements include a valve, a heating element, a pump, etc. Wireless field devices can measure any of a number of process characteristics such as, for example, pressure, level, flow velocity, mass flow, pH, temperature, density, and conductivity or can monitor process equipment for such things as vibration, strain or corrosion or can monitor the general plant environment for such things as fire and gas detection or can be used for locating the present position of workers and equipment. Field devices 102 and 104 are configured for wireless communication over a wireless network and include antennas 116 and 118, respectively. Through this wireless communication, the field devices 116, 118 can communicate with each other, or can communicate with a gateway at remote locations such as process control room 120, which is illustrated as including a host computer 124 coupled to the gateway. This wireless communication can be in accordance with any wireless communication techniques, for example, TDMA, CDMA, GSM, etc., as well as, for example, a wireless IEC 62591 communication standard protocol.

As discussed below in more detail, example field devices 102 and 104 can include power supplies having a removable primary power source. Removing the primary power source can, for example, provide access to at least one electrical access terminals which can be used to access electrical circuitry within the field device 102 or 104. When the primary power source is removed, it can be replaced with a replacement primary power source.

Figure 9:
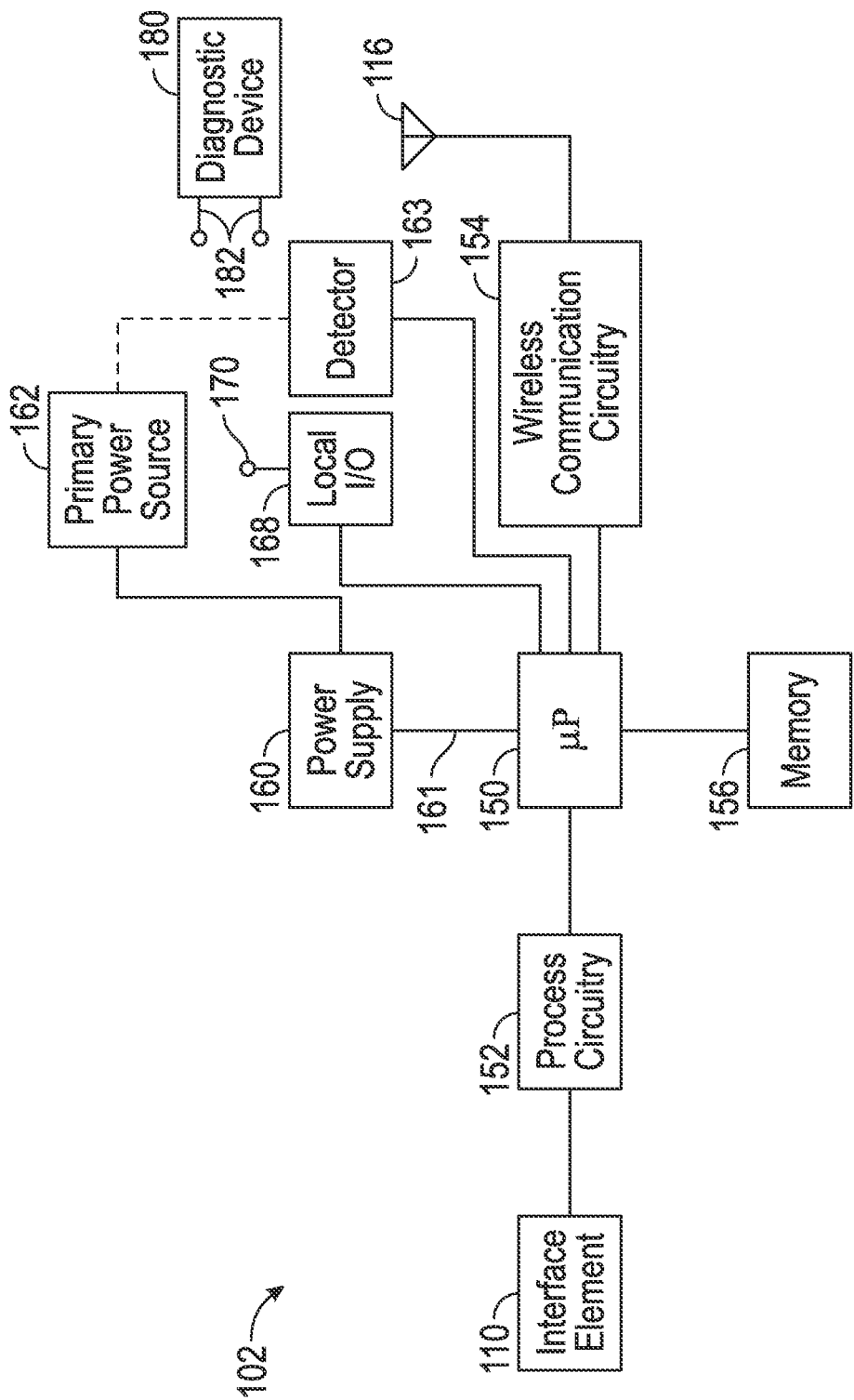
FIG. 9 illustrates a simplified block diagram of the field device shown in FIG. 8, in accordance with an alternative embodiment.

FIG. 9 illustrates a simplified block diagram of the field device 102. Field device 102 can include, for example, a microprocessor 150, which couples to process circuitry 152 to the process interface element 110. The microprocessor is configured to communicate using wireless communication circuitry 154 which couples to antenna 116. Microprocessor 150 operates in accordance with instructions stored in memory 156. The memory 156 can also be used to store information, for example, for future retrieval. A power management circuit 160 can be used to condition power to circuitry within field device 102. An optional communication connection 161 can also be provided between the power management circuit 160 and microprocessor 150.

The power management circuit 160 can provide stable power to the circuitry using power from a primary power source 162. As illustrated in FIG. 9, a local input/output port 168 can be provided and coupled to the microprocessor 150. At least one access terminal 170 may be employed to couple to the local I/O port 168 using, for example, a hand held communicator or other test equipment. Additionally, the at least one access terminal 170 may be used to couple to a process variable sensor for process control element, or other circuitry.

Figure 10:
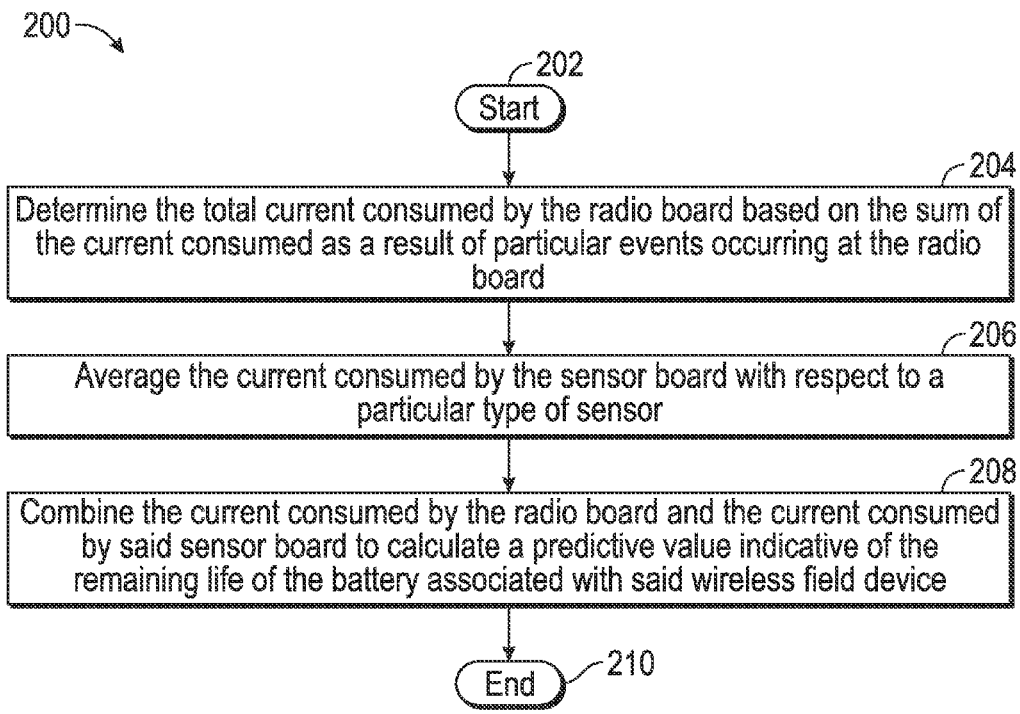
FIG. 10 illustrates a flow chart of operations depicting logical operational steps of a method for calculating accurate battery percentage usage in wireless field devices, in accordance with an alternative embodiment.

FIG. 10 illustrates a flow chart of operations depicting logical operational steps of a method 200 for calculating accurate battery percentage usage in wireless field devices, in accordance with an alternative embodiment. As indicated at block 202, the method 200 can be initiated. Thereafter, as shown at block 204, a step or logical operation can be implemented for determining the total current consumed by a radio board associated with a wireless field device based on the sum of the current consumed as a result of particular events occurring at the radio board. Then, as depicted at block 206, a step or logical operation can be implemented for averaging the current consumed by the sensor board of the wireless field device with respect to particular type of sensor. Thereafter, as shown at block 208, a step or logical operation can be implemented for combining the current consumed by the radio board and the current consumed by the sensor board in the wireless field device to calculate a predictive value indicative of the remaining life of the battery associated with the wireless field device. The method 200 can then end, as shown at block 210.

Additional steps or logical operations may include, for example, analyzing data derived from the radio board to determine the total current consumed by the radio board and/or analyzing data derived from the sensor board to determine the current consumed by the sensor board and/or calculating the predictive value. The particular events can include, for example, at least one of a transmission mode, a reception mode, and/or a sleep mode associated with the radio board. The particular events are associated with events that occur with respect to a wireless field router. The sensor board can be associated, for example, with at least one of the following types of sensors: a temperature sensor, a pressure sensor, and/or a humidity sensor.

The disclosed embodiments offer a number of advantages. For example, the delta based battery consumption approach provides more accurate battery life remaining results as the current consumption is considered over a substantially good period of time. The disclosed approach can easily reset statistics related counters to handle a new battery insertion case. Also; the counters when read as 0xFFFFFFFF's (factory fresh devices), the counter values are automatically reset to 0. The disclosed approach additionally provides an accurate battery life remaining forecast even when publish periods are changed by the end user during run time. Finally, the transmit power level change, which normally is a dynamically changing parameter, during run time is also considered for battery forecast.

Note that example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc., may be used herein to describe various elements, components, regions, layers, and/or sections, these elements, components, regions, layers, and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, the term module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

The term code, as used above, may include software, firmware, byte-code and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "averaging" or "combining" or the like, may refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, USB drives, FLASH drives, magnetic-optical disks, read-only memories (ROMs), random access memories (RAMS), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein, and any references to specific languages are provided for disclosure of enablement and best mode of the present invention.

The present disclosure is well suited to a wide variety of computer network systems over numerous topologies. Within this field, the configuration and management of large networks comprise storage devices and computers that are communicatively coupled to dissimilar computers and storage devices over a network, such as the Internet.

Figure 11:
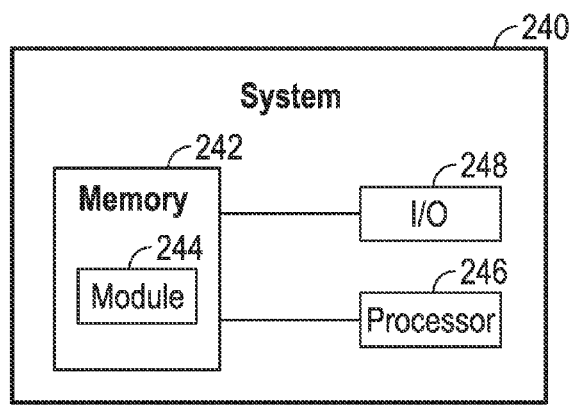
FIG. 11 illustrates a block diagram depicting an example data-processing system in which aspects of the disclosed embodiments may be implemented.

FIG. 11 illustrates a block diagram depicting an example data-processing system 240 in which aspects of the disclosed embodiments may be implemented. System 240 can be, for example, a computing device such as a server, a hand held computing device, a desktop computer, etc., which is capable of communicating with, for example, system 100 shown in FIG. 8 and devices thereof and other systems/such and networks, such as those shown in, for example, FIGS. 2 and 3. System 240 generally includes a memory 242, which can store a module 244 that includes logical instructions for performing, for example, the method 200 shown in FIG. 10. Such logical instructions can be processed via a processor 246. Input/Output components 248 can communicate with other devices and modules (hardware and/or software).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A method for accurately calculating battery consumption in a wireless field device, said method comprising:
providing a wireless field device having a radio board operatively connected to a sensor board, said sensor board operatively and electrically connected to a battery associated with said wireless field device, wherein slot structured events occur at said radio board;
determining a total current consumed by said radio board associated with said wireless field device based on a sum of a current consumed as a result of said slot structured events occurring at said radio board;
averaging a current consumed by said sensor board of said wireless field device with respect to a particular type of sensor and a reporting period thereof;
combining said current consumed by said radio board and said current consumed by said sensor board in said wireless field device in response to averaging said current consumed by said sensor board with respect to said particular type of said sensor and said reporting period to calculate a predictive value indicative of a remaining life of said battery associated with said wireless field device;
automatically monitoring said slot structured events and cumulative uptime data from an initial time said battery was placed in said wireless field device as a fresh battery; and
wherein said determining said current consumed by said radio board associated with said wireless device, further comprises: determining said current consumed by said radio board associated with said wireless device based on said sum of said current consumed as a result of said slot structured events and said cumulative uptime data.

2. The method of claim 1 further comprising analyzing data derived from said radio board to further assist in determining said total current consumed by said radio board.

3. The method of claim 1 further comprising analyzing data derived from said sensor board to further assist in determining said current consumed by said sensor board.

4. The method of claim 1 wherein said wireless field device is configured for wireless communication over a wireless network, said wireless field device having at least one antenna for communication with said wireless network.

5. The method of claim 1 wherein said slot structured events include at least one of a transmission mode, a reception mode, and a sleep mode associated with said radio board.

6. The method of claim 1 wherein said wireless field device comprises a wireless field router.

7. The method of claim 1 wherein said sensor board is associated with a group of sensors including said particular type of sensor, said group of sensors including at least one of: a temperature sensor, a pressure sensor, and a humidity sensor.

8. A system for accurately calculating battery consumption in a wireless field device, said system comprising:
a wireless field device having a radio board operatively connected to a sensor board, said sensor board operatively and electrically connected to a battery associated with said wireless field device, wherein slot structured events occur at said radio board;
at least one processor; and
a non-transitory computer-usable medium embodying computer program code, said non-transitory computer-usable medium capable of communicating with said at least one processor, said computer program code comprising instructions executable by said at least one processor and configured for:
determining a total current consumed by said radio board associated with said wireless field device based on a sum of a current consumed as a result of said slot structured events occurring at said radio board;
averaging a current consumed by said sensor board of said wireless field device with respect to a particular type of sensor and a reporting period thereof;
combining said current consumed by said radio board and said current consumed by said sensor board in said wireless field device in response to averaging said current consumed by said sensor board with respect to said particular type of said sensor and said reporting period to calculate a predictive value indicative of a remaining life of said battery associated with said wireless field device;
automatically monitoring said slot structured events and cumulative uptime data from an initial time said battery was placed in said wireless field device as a fresh battery; and
wherein said determining said current consumed by said radio board associated with said wireless device, further comprises: determining said current consumed by said radio board associated with said wireless device based on said sum of said current consumed as a result of said slot structured events and said cumulative uptime data.

9. The system of claim 8 wherein said instructions are further configured for analyzing data derived from said radio board to further assist in determining said total current consumed by said radio board.

10. The system of claim 8 wherein said instructions are further configured for analyzing data derived from said sensor board to further assist in determining said current consumed by said sensor board.

11. The system of claim 8 wherein said wireless field device is configured for wireless communication over a wireless network, said wireless field device having at least one antenna for communication with said wireless network.

12. The system of claim 8 wherein said slot structured events include at least one of a transmission mode, a reception mode, and a sleep mode associated with said radio board.

13. The system of claim 8 wherein said wireless field device comprises a wireless field router.

14. The system of claim 8 wherein said sensor board is associated with a group of sensors including said particular type of sensor, said group of sensors including at least one of: a temperature sensor, a pressure sensor, and a humidity sensor.

15. A computer program product comprising a non-transitory computer usable medium including a computer readable program, wherein the computer readable program when executed on a computer causes the computer to:
determine a total current consumed by a radio board associated with a wireless field device based on a sum of a current consumed as a result of said slot structured events occurring at said radio board, said wireless field device having a radio board operatively connected to a sensor board, said sensor board operatively and electrically connected to a battery associated with said wireless field device, wherein slot structured events occur at said radio board;

average a current consumed by said sensor board of said wireless field device with respect to a particular type of sensor and a reporting period thereof;

combine said current consumed by said radio board and said current consumed by said sensor board in said wireless field device in response to said averaging said current consumed by said sensor board with respect to said particular type of said sensor and said reporting period to calculate a predictive value indicative of a remaining life of said battery associated with said wireless field device;

automatically monitor said slot structured events and cumulative uptime data from an initial time said battery was placed in said wireless field device as a fresh battery; and wherein said determine said current consumed by said radio board associated with said wireless device, further comprises: determine said current consumed by said radio board associated with said wireless device based on said sum of said current consumed as a result of said slot structured events and said cumulative uptime data.

16. The computer program product of claim 15 wherein said sensor board is associated with a group of sensors including said particular type of sensor, said group of sensors including at least one of: a temperature sensor, a pressure sensor and a humidity sensor.

17. The computer program product of claim 15 wherein the computer readable program when executed on a computer causes the computer to analyze data derived from said sensor board to assist in determining said current consumed by said sensor board.

18. The computer program product of claim 15 wherein said wireless field device is configured for wireless communication over a wireless network, said wireless field device having at least one antenna for communication with said wireless network.

19. The computer program product of claim 15 wherein said slot structured events include at least one of a transmission mode, a reception mode, and a sleep mode associated with said radio board.

20. The computer program product of claim 19 wherein said wireless field device comprises a wireless field router.

* * * * *